(12) United States Patent
Escamilla et al.

(10) Patent No.: US 12,267,959 B2
(45) Date of Patent: Apr. 1, 2025

(54) SYSTEM AND METHOD FOR REVERSIBLE CONNECTION OF INTERCHANGEABLE COMPONENTS

(71) Applicant: Dell Products L.P., Round Rock, TX (US)

(72) Inventors: Eduardo Escamilla, Round Rock, TX (US); Matthew Dang, Austin, TX (US); James Utz, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 412 days.

(21) Appl. No.: 17/871,672

(22) Filed: Jul. 22, 2022

(65) Prior Publication Data

US 2024/0032194 A1  Jan. 25, 2024

(51) Int. Cl.
*H05K 1/11* (2006.01)
*H01R 12/72* (2011.01)
*H01R 13/11* (2006.01)

(52) U.S. Cl.
CPC ........... *H05K 1/117* (2013.01); *H01R 12/721* (2013.01); *H01R 13/11* (2013.01); *H05K 2201/09145* (2013.01); *H05K 2201/09409* (2013.01)

(58) Field of Classification Search
CPC ......... H05K 1/117; H05K 2201/09145; H05K 2201/09409; H01R 12/721; H01R 13/11

USPC .......................................................... 439/59
See application file for complete search history.

(56) References Cited

U.S. PATENT DOCUMENTS

| | | | |
|---|---|---|---|
| 8,566,500 B2 * | 10/2013 | Cong | G06F 13/409 710/310 |
| 8,626,983 B2 * | 1/2014 | Yin | G06F 13/4045 710/316 |
| 8,830,683 B2 * | 9/2014 | Cong | G06F 1/189 361/679.01 |
| 10,488,893 B1 * | 11/2019 | Keilers | G06F 1/186 |
| 2014/0160663 A1 * | 6/2014 | Zhou | G06F 13/382 361/679.32 |
| 2015/0016047 A1 * | 1/2015 | Seok | G11C 7/02 361/679.32 |
| 2017/0215296 A1 * | 7/2017 | Tsai | H01R 12/716 |

FOREIGN PATENT DOCUMENTS

WO  WO-2016018296 A1 *  2/2016  ............. G06F 1/183

* cited by examiner

*Primary Examiner* — Peter G Leigh
(74) *Attorney, Agent, or Firm* — WOMBLE BOND DICKINSON (US) LLP

(57) ABSTRACT

Methods, systems, and devices for providing computer implemented services are disclosed. To provide the computer implemented services, hardware resources available to data processing systems may be customized. The hardware resources may be customized through addition or replacement of interchangeable hardware components. The interchangeable hardware components may include features that may improve the likelihood of successfully adding or replacing the interchangeable hardware components.

20 Claims, 15 Drawing Sheets

SYSTEM AND METHOD FOR REVERSIBLE CONNECTION OF INTERCHANGEABLE COMPONENTS

FIELD

Embodiments disclosed herein relate generally to device management. More particularly, embodiments disclosed herein relate to systems and methods to establish electrical connections between devices in data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The computer-implemented services may be limited by the numbers and types of hardware components of the computing devices.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1:
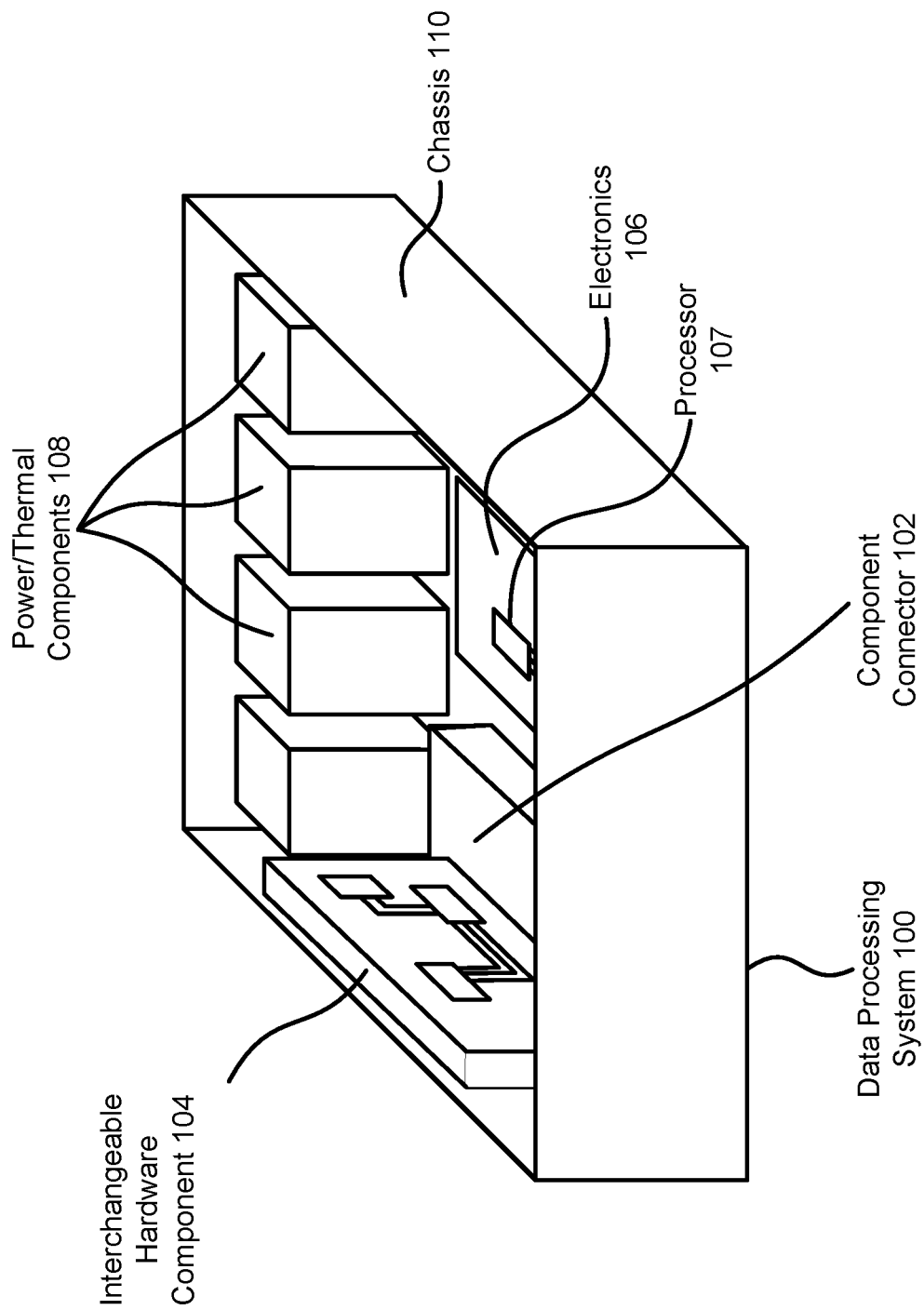
FIG. 1 shows a diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods, systems, and devices for customizing data processing systems to provide computer implemented services. The data processing systems may be customized through additional, replacement, and/or removal of hardware components. The data processing systems may be customized to include hardware components used to provide corresponding types of computer implemented services.

The hardware component may be customized using interchangeable cards. The interchangeable cards may host various hardware devices thereby facilitate changes in the hardware components of a data processing system through connection with an interchangeable card.

To facilitate connection to interchangeable hardware components, the interchangeable hardware components may include one or more physical features to manage insertion forces required for connection of the interchangeable card to a connector through which the interchangeable cards may be connected to other hardware components of a data processing system. The features may include, for example, a staggered edge. The staggered edge may reduce peak insertion force requirements (e.g., when compared to flat edges) for insertion of the interchangeable hardware components.

The reduced peak insertion force requirements may reduce the likelihood of the interchangeable hardware components being damaged during insertion, improper insertion, and/or other undesirable outcomes when an interchangeable hardware component is inserted into a connector. Consequently, a data processing system in accordance with an embodiment may have a greater uptime (e.g., due to reduce insertion errors or other issues), may be less costly to maintain (e.g., due to reduce replacement costs for damaged components), and/or may provide other benefits.

Thus, embodiments disclosed herein may provide an improved interchangeable hardware component that is less likely to be damaged (and/or less likely to damage components of the data processing systems) due to excessive force by reducing the likelihood of excessive force being used on hardware components when inserting the hardware components into component connectors of the data processing systems. Consequently, the likelihood of forming operable connections necessary for use and operation of the interchangeable hardware components may be improved.

In an embodiment, a data processing system for providing computer-implemented services using interchangeable hardware components is provided. The data processing system may include a processor; a component connector electrically connected to the processor and adapted to receive at least one of the interchangeable hardware components; the one interchangeable hardware component comprising: a discrete hardware component for providing the computer-implemented services in cooperation with the processor; a connection portion comprising: electrical contacts adapted to form electrical connections with the component connector to facilitate communication between the discrete hardware component and the processor; a leading edge adapted to be inserted into the component connector and deform electrical contacts of the component connector that are complementary to the electrical contacts of the connection portion to establish a communication path for the communication between the discrete hardware component and the processor, the leading edge comprising: a protruding portion, and an indented portion adapted to make physical contact with the electrical contacts of the components connector after the protruding portion makes physical contact with the electrical contacts during an insertion of the leading edge into the component connector.

The communication path may be operable while the electrical contacts of the connection portion are in physical contact with the electrical contacts of the component connector. The communication may be an electrical path formed with the electrical contacts of the component connector.

The protruding portion may have a protrusion depth of an amount based on a degree of insertion of the protruding edge into the component connector required to deform a portion of the electrical contacts of the component connector from a first position to a second position prior to the indented portion making physical contact with any of the electrical contacts of the component connector.

The first position may be an at rest position where no forces are applied by the connection portion to the electrical contacts of the component connector.

The second position is a deformed position where the forces are applied by the connection portion to the electrical contacts of the component connector.

The leading edge may also include a second protruding portion. The indented portion may be positioned between the protruding portion and the second protruding portion.

The leading edge may also include a plurality of protruding portions comprising the protruding portion and the second protruding portion; and a plurality of indented portions comprising the indented portion.

The plurality of protruding portions and the plurality of indented portions may be positioned in an alternating pattern.

Each of the plurality of protruding portions may be substantially similar to the others of the plurality of the protruding portions. For example, the widths of the protruding portions may be based on similar criteria, such as mechanical features of a component connector.

The leading edge may also include a second indented portion, the indented portion and the second indented portion having different levels of indentations such that the protruding portions, the indented portion and the second indented portions make initial physical contact with the electrical contacts of the component connector at different times during insertion of the leading edge into the component connector.

The protruding portion may also have a width corresponding to a subset of the electrical contacts of the components connector, the subset of the electrical contacts being mechanically linked to each other for deformation and mechanically delinked from other subsets of the electrical contacts for deformation.

In an embodiment, an interchangeable hardware component as discussed above is provided.

In an embodiment, a method for connecting an interchangeable hardware component is provided.

Turning to FIG. 1, a diagram illustrating a system in accordance with an embodiment is shown. The system may provide computer implemented services. To provide the computer implemented services, the system may include data processing system 100.

Data processing system 100 may include functionality to provide various types of computer implemented services. The computer implemented services may include any number and type of computer implemented services. Computer implemented services may include, for example, database services, data processing services, electronic communication services, and/or any other services that may be provided using one or more computing devices. Other types of computer implemented services may be provided by data processing system 100 without departing from embodiments disclosed herein.

To provide the computer implemented services, data processing system 100 may include various components including, for example, electronics 106 and power/thermal components 108. The operation of these components may provide the computer implemented services.

Electronics 106 may include various types of hardware components such as processors (e.g., 107), memory modules, storage devices, communications devices, and/or other types of devices. Any of these hardware components may be operably connected to one another using circuit card traces, cabling, connectors, etc. that establish electrical connections used to transmit information between the hardware components.

Power/thermal components 108 may power any of the components of data processing systems 100 and/or thermally mange any of the components of data processing systems 100. For example, power/thermal components 108 may include power supplies, fans, and/or other types of devices usable to power and/or thermally manage the components.

To provide different types of computer implemented services, various types of computing resources (e.g., provided by hardware devices of electronics 106) may be utilized. Different types of computer implemented services may use the functionalities of different types of hardware components. For example, database services may use large amounts of the functionality of storage devices while instant communications may use large amounts of the functionality of communication devices such as network interface cards while minimally using the functionality of storage devices. Consequently, it may be desirable to customize the numbers and types of hardware devices of a data processing systems based on the types of computer implemented services that the data processing system will provide.

To facilitate customizability of the available different types of computing resources (e.g., processing resources provided by processors, memory resources provided by memory modules, storage resources provided by storage devices, communication bandwidth provided by communication devices, etc.) provided by hardware components, data processing system 100 may include functionality to reversibly connect interchangeable hardware components with electrics 106. The interchangeable hardware components may include various types of hardware components thereby allowing the numbers and types of available hardware components of data processing system 100 to be customized.

To facilitate reversible connection of interchangeable hardware components, data processing system 100 may include component connector 102. Component connector 102 may facilitate reversible connection of various interchangeable hardware components (e.g., 104) to electronics 106. While connected via component connector 102, an interchangeable hardware component (e.g., 104) may contribute its computing resources for the performance of various tasks managed by electronics 106. Consequently, the computing resources of a data processing system may be modified by adding and/or removing interchangeable hardware components to component connector 102.

For example, interchangeable hardware component 104 may be operably connected to processor 107 through component connector 102. Processor 107 may task interchangeable hardware component 104 with performing various functions that may be used by processor 107 in providing various computer implemented services. However, at other points in time processor 107 may be tasked with providing other services that do not need the resources provided by interchangeable hardware component 104. In such a scenario, interchangeable hardware component 104 may be removed and/or other interchangeable hardware components may be inserted into component connector 102 to be more useful in providing the other tasks performed by processor 107. For example, if processor 107 is initially performing a compute heavy workload, a first interchangeable hardware component may be placed in component connector 102 and used by processor 107. However, if the typical task performed by processor 107 switches from a compute heavy workload to a storage heavy workload that is not assisted by the compute-implemented interchangeable hardware component, then the interchangeable hardware component may be replaced with a storage-optimized interchangeable hardware component such as an add-in card that has large numbers of solid state storage chips, storage controllers, and/or other components optimized for high speed storage and/or data retrieval. In this manner, the hardware components of data processing system 100 available to perform various types of computer implemented services may be customized through the connection of various types of interchangeable hardware components using component connector 102.

In an embodiment, component connector 102 is implemented as a peripheral component interconnect express (PCIe) device slot or other type of structure for connecting various devices that host various hardware components that may contribute computing resources to a data processing system. A device slot may be physical structure that includes electrical contacts in which complimentary electrical contacts of interchangeable hardware components may be positioned to establish electrical connections to electronics 106 and/or other devices of data processing system 100.

In FIG. 1, component connector 102 is illustrated as connecting interchangeable hardware component 104 with the rest of data processing system 100. Component connector 102 may be able to operably connect the data processing system 100 to various implementations of interchangeable hardware components. When connecting interchangeable hardware component 104 to the data processing system 100, component connector 102 may operably connect interchangeable hardware component 104 to electronics 106 and/or other components.

For example, component connector 102 may include one or more electrical connectors (which may include any number of electrical contacts such as circuit card pads) which make electrical connections to interchangeable hardware components (e.g., using complementary electrical connectors on the interchangeable hardware components) positioned in component connector 102. The electrical connectors of component connector 102 may be operably connected to electronics 106 (e.g., via traces of a circuit card, connectors on the circuit card, cabling, etc.) thereby facilitating operable connection between interchangeable hardware components positioned in component connector 102 and various other components of data processing system 100.

Interchangeable hardware component 104 may be implemented with a physical device that includes any number of hardware components. When positioned in component connector 102, one or more of the hardware components of the interchangeable hardware component 104 may be operably connected to electronics 106 (or a portion thereof) and/or other devices. As noted above, the interchangeable hardware component 104 may include complementary connectors that allow for formation of operable connection.

To connect interchangeable hardware component 104 to component connector 102, a portion of interchangeable hardware component 104 with the complementary electrical contacts may be inserted into component connector 102. Component connector 102 may include features to maintain physical contact between the complementary electrical contacts and the electrical contacts of component connector 102 while the portion of interchangeable hardware component 104 is positioned in component connector 102. For example, component connector 102 may include deformable features that continuously press the electrical contacts against the complementary electrical contacts.

However, these features of component connector 102 may require that force may need to be applied to interchangeable hardware component 104 to insert the portion of it into component connector 102. Due to the level of needed force, it may be challenging to insert interchangeable hardware component 104 into component connector 102. Additionally, misapplication of force during insertion of interchangeable hardware component 104 may cause interchangeable hardware component 104 to not established desired electrical connections. For example, the complementary electrical contacts may be misaligned with respect to the electrical contacts of component connector 102 when force is misapplied to interchangeable hardware component 104. Larger amounts of force required to insert interchangeable hardware component 104 into component connector 102 may increase the likelihood of misalignment occurring, may place undesired levels of physical stress on the electrical contacts of the component or the connector, and/or may cause other problems to occur.

In general, embodiments disclosed herein relate to systems, methods, and devices for improving the likelihood of forming and/or maintaining desired operable connections between interchangeable hardware component 104 and component connector 102. To do so, one or more features of interchangeable hardware component 104 may facilitate insertion of it into component connector 102 using reduced levels of force. To do so, embodiments disclosed herein may facilitate insertion and alignment of interchangeable hardware components (or more specifically, complementary electrical contacts) into component connectors (or more specifically, in physical contact with electrical contacts of component connectors). By facilitating insertion and alignment of interchangeable hardware components with component connectors, it may be more likely that desired operable connections be formed and/or maintained.

For example, the electrical contacts and/or complimentary electrical contacts of component connector 102 and interchangeable hardware component 104, respectively, may conform to a standard such as the PCIe standard (or other type of standard). The standard may presume a certain degree of alignment between the electrical contacts and the complementary electrical contacts. If the degree of alignment is not met, undesired electrical connections may be formed.

To improve the likelihood of forming and/or maintaining desired operable connections, a system in accordance with embodiments disclosed herein may include interchangeable hardware components that include staggered connection portions. The staggered connection portions may reduce a peak force level required to insert interchangeable hardware component 104 into component connector 104.

The staggered connection portions may reduce the peak force required for insertion by distributing the points in time at which various portions of interchangeable hardware component 104 may contact with corresponding portions of component connector 102. In contrast, a connection portion that is not staggered may require a larger amount of peak insertion force due to more features of the connection portion making physical contact with the corresponding portions of the component connector at the same time.

Thus, a data processing system in accordance with embodiments disclosed herein may have improved flexibility with respect to its available hardware components through the insertion and removal of interchangeable hardware components that may be more likely to successfully form electrical connections necessary for use of the hardware component so that interchangeable hardware components. Refer to FIGS. 2B-5E for additional details regarding interchangeable hardware components with staggered connection portions in accordance with embodiments disclosed herein.

Any of the components of data processing system 100 may be positioned in chassis 110. Chassis 110 may include an enclosure in which physical structures such as processors, power supplies, and/or other devices may be positioned. Chassis 110 may facilitate placement and management of electronics 106 and/or other components in a computing environment. For example, chassis 110 may be a form factor compliant (e.g., a ½ U sled) enclosure usable to integrate data processing system 100 into a high density computing environment, such as a rack mount chassis management system.

While illustrated in FIG. 1 with a limited number of specific components, a system may include additional, fewer, and/or different components without departing from embodiments disclosed herein.

In the following figures, dashed lines are used to indicate that structures may continue from that depicted in the figures. For example, with respect to FIG. 2A in which a view of interchangeable hardware component 104 is depicted, the dashed line indicates that circuit card 120 and/or other portions of interchangeable hardware component 104 may exist above the dashed line. For conciseness, only some portions of various components are illustrated in the following figures. It should be understood that any of the depicted devices may include additional components, portions, structures, etc. from the limited number shown in the figures.

Figure 2A:
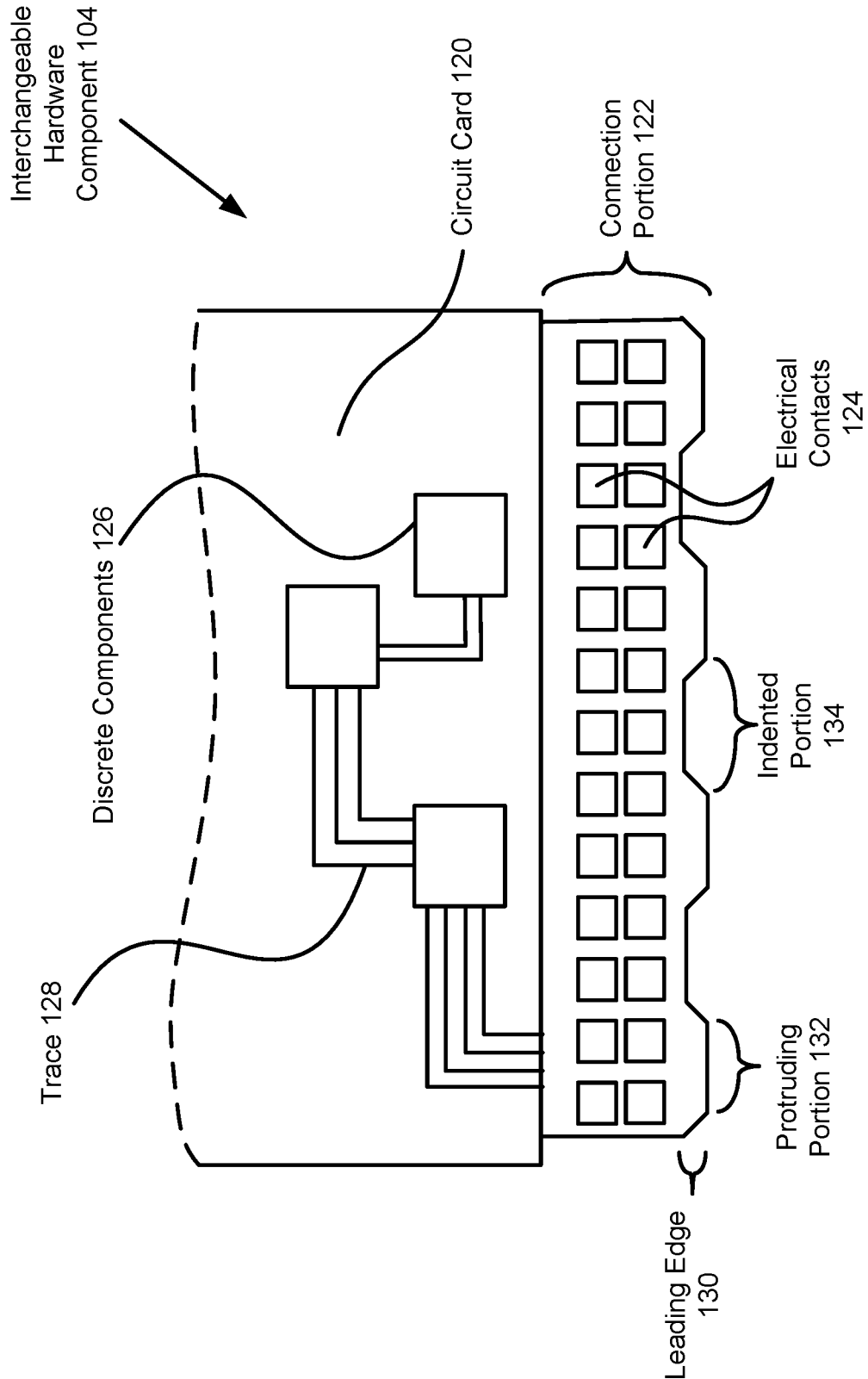
FIGS. 2A-2D show diagrams illustrating an interchangeable hardware component in accordance with an embodiment.

Turning to FIG. 2A, a diagram illustrating interchangeable hardware component 104 in accordance with an embodiment is shown. As discussed above interchangeable hardware component 104 may contribute computing resources (e.g., by performing operations) to a data processing system when positioned in a component connector.

To provide computing resources, interchangeable hardware component 104 may include circuit card 120 and any number of discrete components 126. Discrete components 126 may include, for example, packaged integrated circuits (e.g., "computer chips"), individual components such as resistor or capacitors, and/or other types of hardware components. Circuit card 120 may include traces 128 that interconnect (e.g., electrically) any of discrete components 126 and electrical contacts 124. While illustrated in FIG. 2A with an example topology, an interchangeable hardware component may include different types and/or arrangements of discrete components and electrical contacts 124, and/or different interconnection topologies facilitated by traces without departing from embodiments disclosed herein.

To provide its functionality, interchangeable hardware component 104 may include connection portion 122. Connection portion 122 may be adapted for insertion into a component connector. Connection portion 122 may include electrical contacts 124 and leading edge 130. Leading edge 130 may be adapted to lead the insertion of connection portion 122 into the component connector 102. When doing so, leading edge 130 may deform electrical contacts and/or other features of the component connector. Doing so may allow connection portion 122 to be inserted into the component connector and facilitate contact between electrical contacts 124 and the electrical contacts of the component connector.

To reduce the peak force for insertion of connection portion 122 into the component connector, leading edge 130 may include protruding portions (e.g., 132) and/or indented portions (e.g., 134). Leading edge 130 may include any number of these portions in any arrangement thereby providing leading edge 130 with a complex contour. The complex contour of leading edge 130, in contrast to a flat edge, may cause protruding portion 132 to make physical contact with features of the component connector earlier in time than indented portion.

For example, protruding portion 132 and indented portion 134 may make physical contact with component connector 102 at different times. This difference in time may decrease the peak force needed to position the interchangeable hardware component 104 in a component connector. The peak force needed to position interchangeable hardware component 104 in component connector 102 may be reduced by causing various portions of component connector (discussed further with respect to FIG. 2C) in stages during the insertion (discussed further with respect to FIG. 4). In contrast, a flat leading edge may simultaneously deform the features of the component connector 102 thereby requiring a higher peak force for deformation.

Protruding portion 132 may have a protrusion depth of an amount based on a degree of insertion of the protruding edge into the component connector required to deform the features the component connector from a first position to a second position. Likewise, indented portion 134 may have an amount of indention depth equal to the protrusion depth of protruding portion 132, and may be adapted to make physical contact with the deformable features of the component connector after the protruding portion 132 makes physical contact with the deformable features of the component connector during an insertion of the leading edge 130 into the component connector.

Protruding portion 132 and/or indented portion 134 may have a width corresponding to a subset of the electrical contacts of the components connector. For example, each subset of the electrical contacts may be mechanically coupled (e.g., mechanically linked) to each other for deformation purposes, and may be mechanically decoupled from other subsets of the electrical contacts for deformation.

While illustrated in FIG. 2A with a limited number of specific components, an interchangeable hardware component may include additional, fewer, and/or different components without departing from embodiments disclosed herein.

Figure 2B:
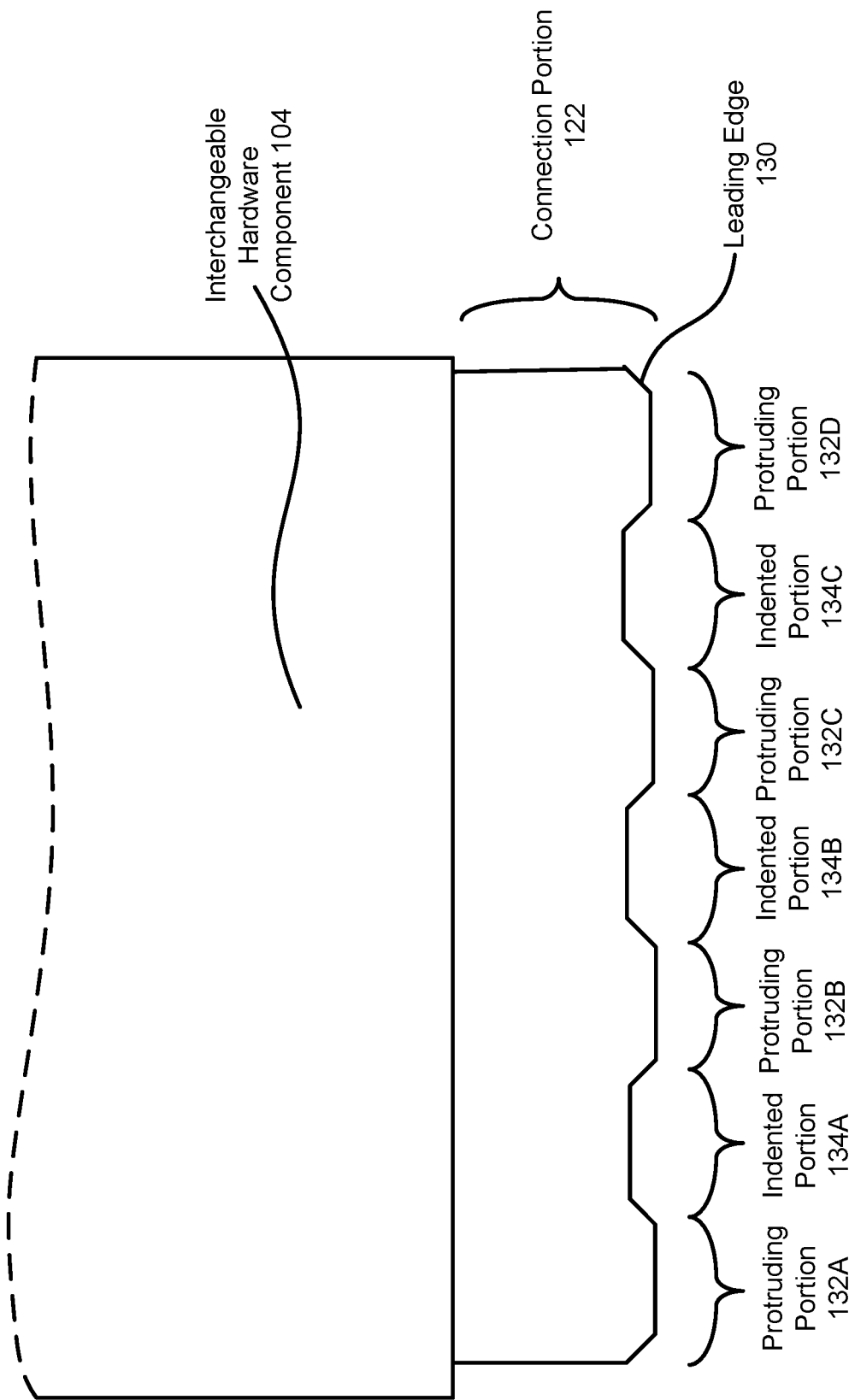
Figure 2C:
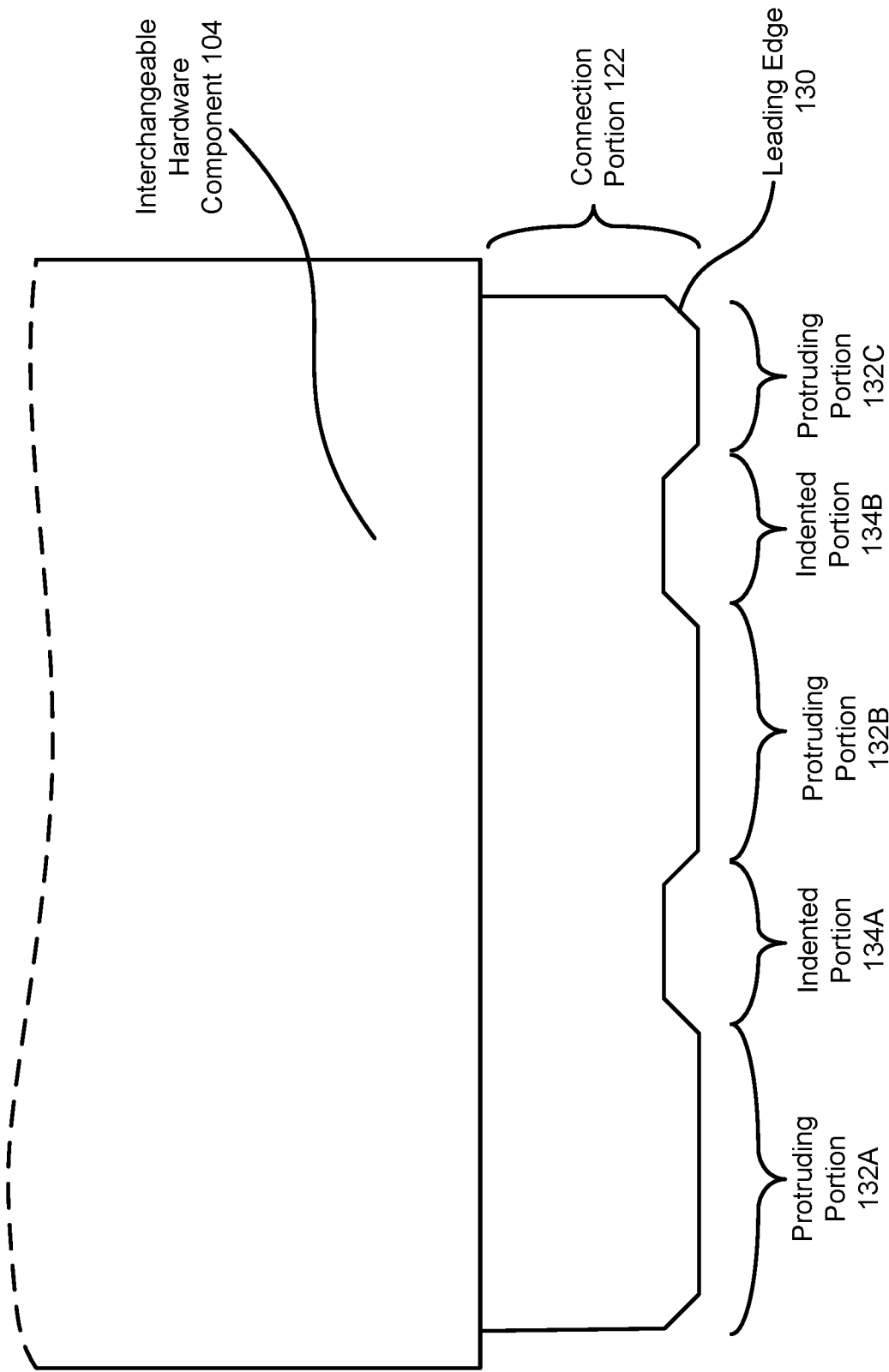
Figure 2D:
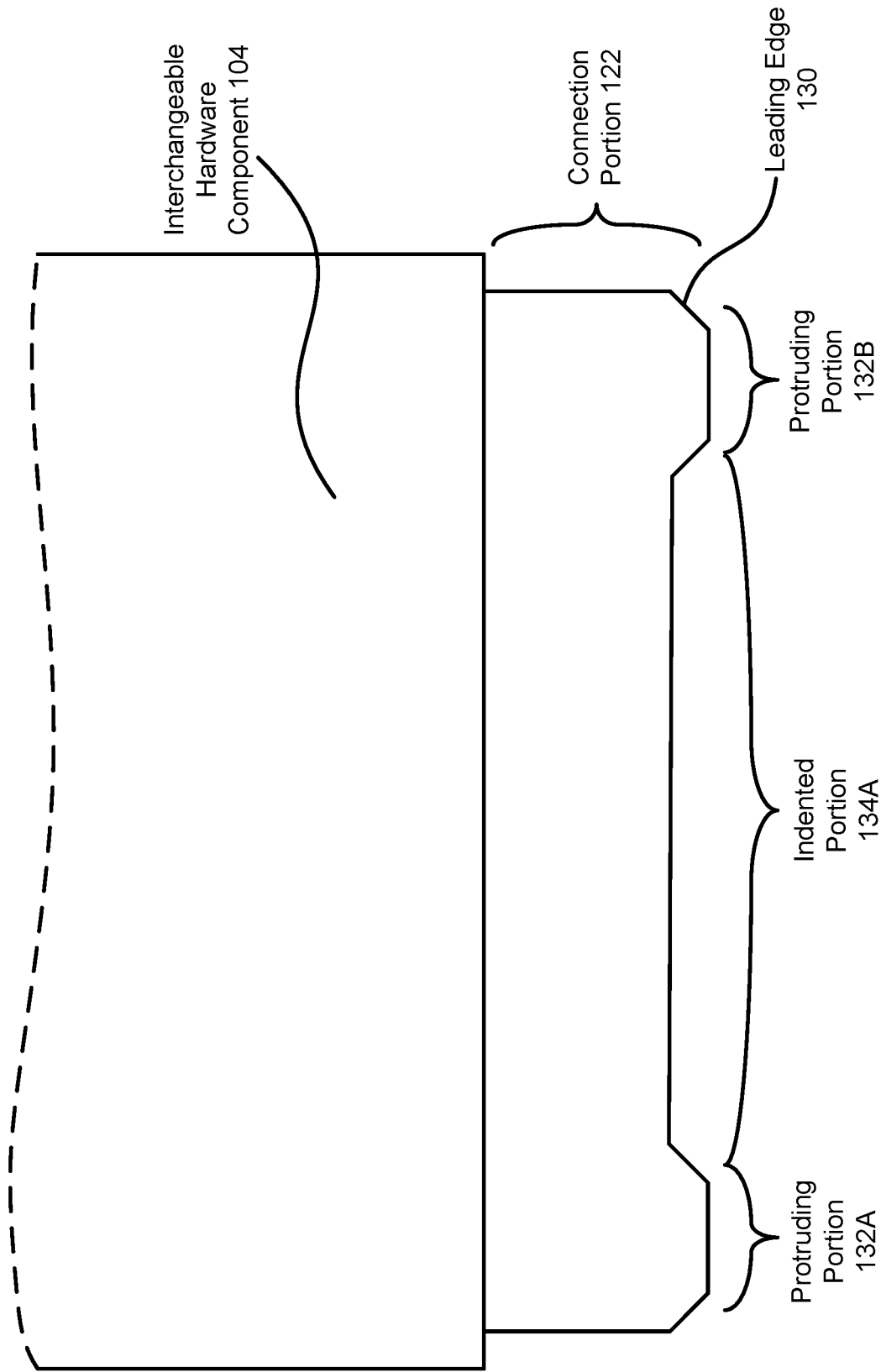

As discussed above, interchangeable hardware component 104 may include a leading edge that may include protruding portions and/or indented portions positioned in various patterns. FIGS. 2B-2D illustrate examples of patterns that of protruding portions and/or indented portions in accordance with an embodiment. For conciseness and clarity, various portions of interchangeable hardware component (e.g., electrical contacts 124) are not shown in these figures.

Turning to FIG. 2B, a first diagram of interchangeable hardware component 104 in accordance with an embodiment is shown. As seen in FIG. 2B, interchangeable hardware component 104 may include a number of protruding portions 132A-132D and a number of indented portions 134A-134C. The protruding portions and the intended portions may alternate along leading edge.

The pattern of protruding portions and indented portions illustrated in FIG. 2C may both reduce peak insertion force and even the distribution of insertion force throughout stages of insertion into a component connector (e.g., due to the large number and similarity of the types of each member of each type of portions). However, the large number of protruding portions and indented portions may increase cost for the leading edge.

Each of the protruding portions and each of the indented portions may have a width that corresponds to a subset of the electrical contacts of the component connectors, as noted above and further discussed with respect to FIGS. 2E-2F.

Turning to FIG. 2C, a second diagram of interchangeable hardware component 104 in accordance with an embodiment is shown. As seen in FIG. 2C, leading edge 130 may include protruding portions 132A-132C and indented portions 134A-134B. In contrast to the pattern shown in FIG. 2B, the pattern and sizes of the protruding portions and indented portions shown in FIG. 2C may change the peak force for insertion into a component connector, but may reduce a cost for manufacturing leading edge 130.

For example, due to the aggregate width of the protruding portions, the initial force level required to deform the component connector may be increased while the force level required for the indented portions to deform the component connector may be reduced. Thus, this pattern may be used when larger peak forces are more desirable for initial stages of the insertion and reduced for levels are desired for latter stages of the insertion.

Turning to FIG. 2D, a third diagram of interchangeable hardware component 104 in accordance with an embodiment is shown. As seen in FIG. 2D, leading edge 130 may include protruding portions 132A-132B and indented portion 134A. In contrast to the pattern shown in FIG. 2C, the pattern and sizes of the protruding portions and indented portions shown in FIG. 2D may change the peak force for insertion into a component connector, but may reduce a cost for manufacturing leading edge 130.

For example, due to the aggregate width of the protruding portions (less than that shown in FIG. 2C), the initial force level required to deform the component connector may be reduced while the force level required for the indented portions to deform the component connector may be increased. Thus, this pattern may be used when reduced peak forces are more desirable for earlier stages of the insertion.

Figure 2E:
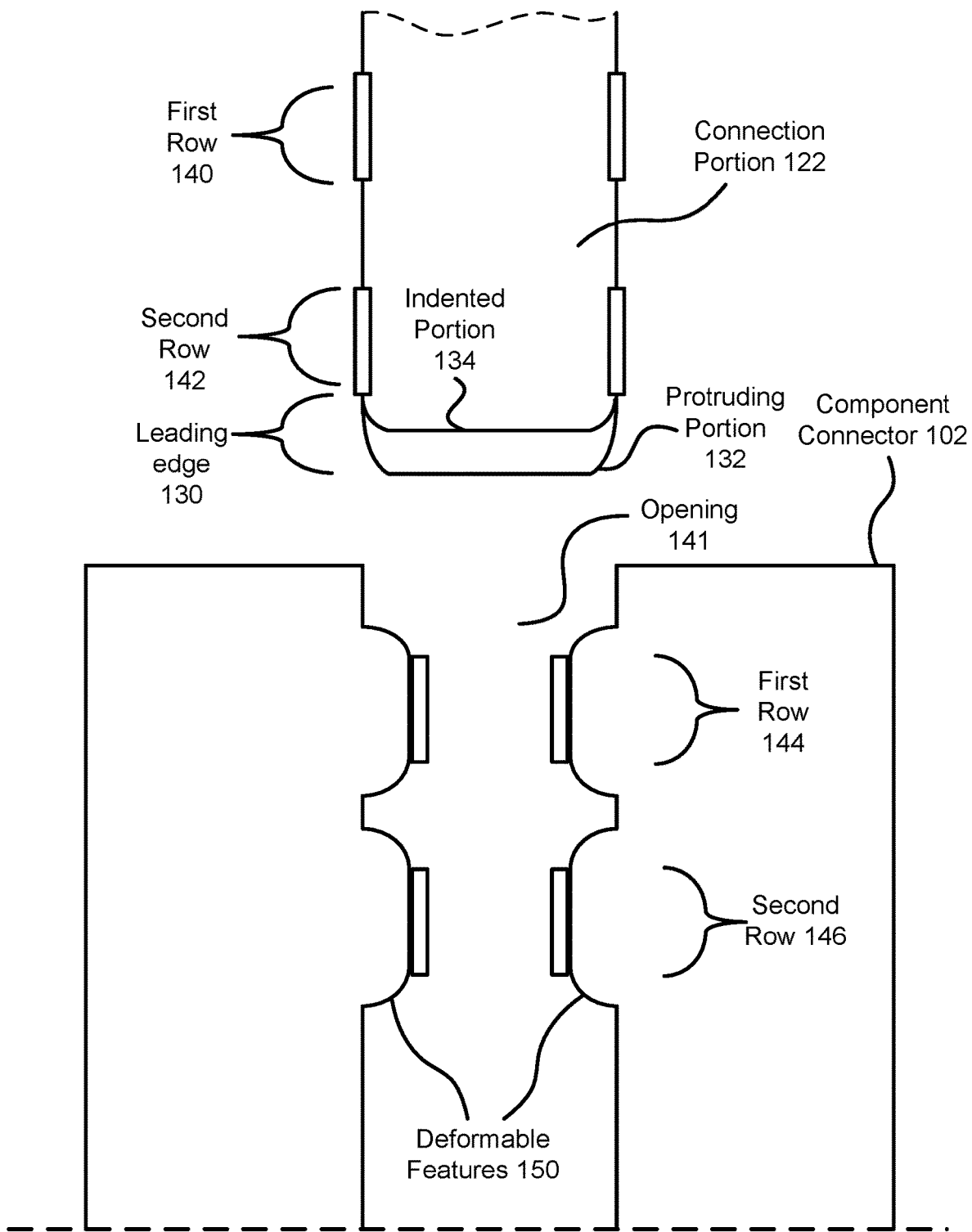
FIGS. 2E-2F show diagrams illustrating a component connector in accordance with an embodiment.
Figure 2F:
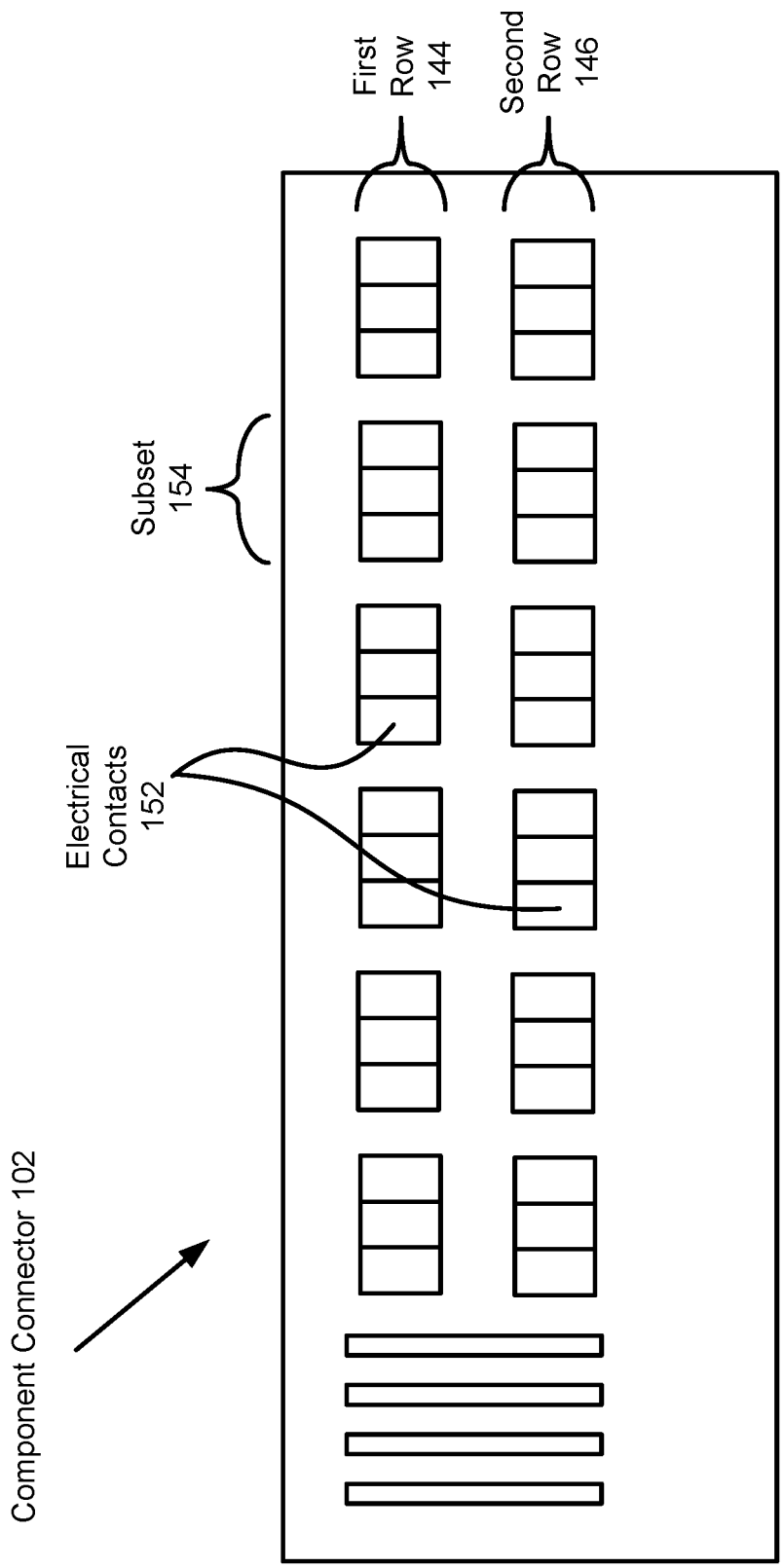

To further clarify embodiments disclosed herein, diagrams of a component connector and/or portions of an interchangeable hardware component are illustrated in FIGS. 2E-2F.

Turning to FIG. 2E, a diagram of interchangeable hardware component 104 and component connector 102 in accordance with an embodiment is shown. In FIG. 2E, an end view aligned with opening 141 of component connector 102 is shown. In the diagram, interchangeable hardware component 104 is depicted in a position and orientation in which it may be inserted into opening 141.

As seen in FIG. 2E, the connection portion 122 may include a first row 140 of electrical contacts and a second row 142 of electrical contacts. First row 140 and second row 142 may each be adapted to operably connect to a first row 144 of complimentary electrical contacts and a second row 146 of complimentary electrical contacts of component connector 102, respectively, while connection portion 122 is inserted in component connector 102 (e.g., to a prescribed depth). The connections may be made and maintained with force applied by deformable features 150.

Deformable features 150 may include any type of structure which may deform in response to leading edge 130 being inserted into component connector 102. First row 144 and second row 146 may be positioned with deformable features 150 so that the deformation of deformable features 150 may cause these rows to be pressed against first row 140 and second row 142, respectively while interchangeable hardware component 104 is positioned in component connector 102. The deformation of deformable features 150 may be reversible (e.g., a material used to form deformable features 150 may have a degree of elasticity).

In order for physical contact to be made between the rows of contacts of the depicted component and connector, force may be applied to the interchangeable hardware component. The force may move the leading edge 130 through opening 141 and into the component connector 102 thereby deforming deformable features 150 and causing first row 144, and then second row 146 to move from a first position to a second position. Leading edge 130 may continue into component connector 102, based on the force of insertion, until interchangeable hardware component 104 and the data processing system, mentioned with respect to FIG. 1, are operably connected via the physical contact between the respective rows on contacts on the component and connector shown in FIG. 2E.

The insertion force may include multiple contributions due to both deformation of deformable features 150 and friction between component connector 102 and interchangeable hardware connector 104 during the insertion. For example, during the insertion, a first level of force may be required for the deformation of deformable features 150 upon which first row 144 is positioned due to protruding portion 132A. Subsequently, a second level of force may be required for the deformation of these deformable features when indented portion 134 makes contact with first row 146. In contrast to these two levels of force, a leading edge that did not include indented and protruding portions may require a larger level of force for deformation of these deformable features. Similar levels of reduction in peak force may be provided with respect to deformation of the deformable features upon which second row 146 is positioned, in later stages of the insertion of interchangeable hardware component 104 into component connector 102. Refer to FIGS. 5A-5E for additional details regarding the stages of the insertion.

Turning to FIG. 2F, a diagram illustrating component connector 102 in accordance with an embodiment is shown. In FIG. 2F, the view point may be from an interior region of component connector 102 and towards an interior wall upon which first row 144 and second row 146 are positioned.

As seen in FIG. 2F, component connector 102 may include electrical contacts 152, grouped into subsets (e.g., 154) of three electrical contacts each. The subsets may include different numbers of electrical contacts, and the groupings may depend, for example, on mechanical coupling between various electrical contacts. For example, in some scenarios groups of the electrical contacts may be mechanically coupled due to the way in which the electrical contacts are manufactured.

Figure 3:
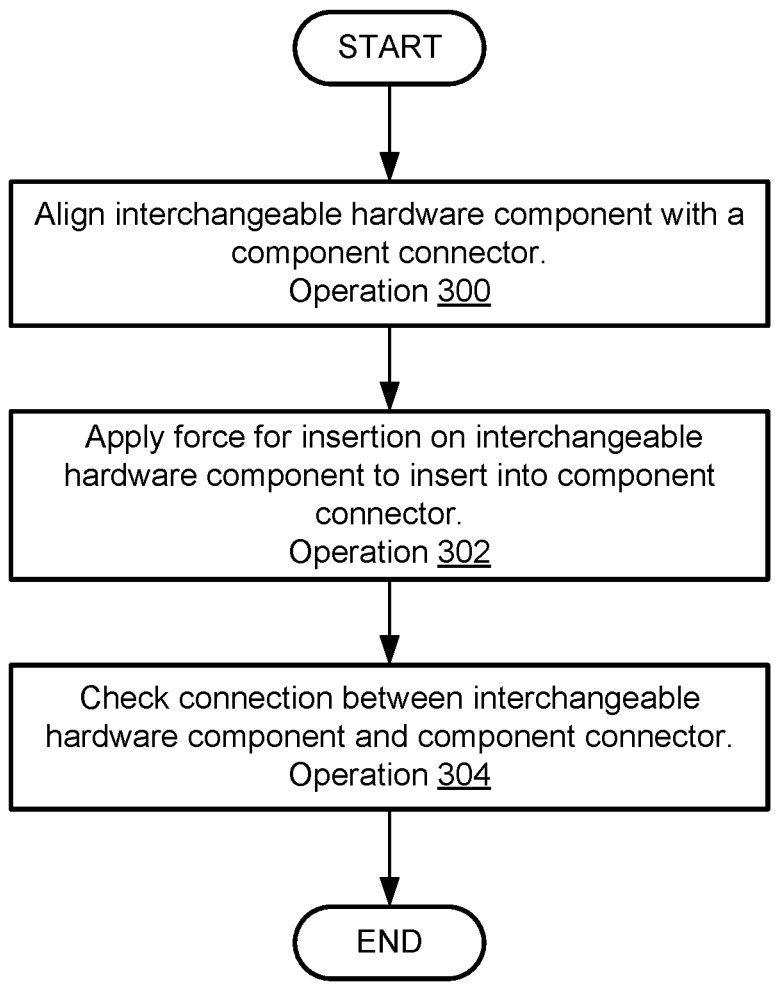
FIG. 3 shows a flow diagram illustrating methods of operably connecting components in a distributed system in accordance with an embodiment.

As discussed above, the components of FIG. 1 may be used to customize the hardware components of a data processing system to meet various goals. FIG. 3 illustrates a method that may be performed to customize the hardware components of a data processing system. In the diagrams discussed below and shown in FIG. 3, any of the operations may be repeated, performed in different orders, and/or performed in parallel with or in a partially overlapping in time manner with other operations.

Turning to FIG. 3, a flow diagram illustrating a method for utilizing an interchangeable hardware component with a staggered edge to form operable connections between the interchangeable hardware component and a data processing system in accordance with an embodiment is shown.

At operation 300, the interchangeable hardware component may be aligned with a component connector. The interchangeable hardware component may be aligned by positioning it above an opening in the component connector so that a leading edge may be inserted into the opening.

At operation 302, force for insertion of the interchangeable hardware component into the component connector may be applied. The force may be applied, for example, by a person pushing the leading edge into the opening. As noted above, the staggered contour of the leading edge may reduce the peak amount of force required for insertion of the leading edge into the component connector.

For example, in a first scenario in which an interchangeable hardware component has a flat leading edge to enter into a component connector, there may be three levels of force that may need to be applied to insert the interchangeable hardware component into a component connector. The three level of force may include (i) a force required for the leading edge to deform a first row of electrical contacts (and/or deformable features upon which the contacts are positioned) of the component connector from a first position to a second position, (ii) a second force required for the leading edge to deform a second row of electrical contacts (e.g., and/or deformable features) of the component connector from a first position to a second position, and (iii) a third force that overcomes friction as the leading edge passes the first and second row of electrical contacts.

To continue the example, in a second scenario in which the interchangeable hardware component has a staggered leading edge, there may be five levels of force that need to be applied in order to insert the interchangeable hardware component into the component connector. However, the largest of these five forces may be less than the largest of the three levels of force for insertion of the flat leading edge. The five levels of force may include (i) a force required for the protruding portions of the leading edge to deform a portion of a first row of electrical contacts of the component connector from a first position to a second position, (ii) a second force required for the indented portions of the leading edge to deform a second portion of the first row of electrical contacts of the component connector from the first position to the second position, (iii) a third force required for the protruding portions of the leading edge to deform a portion of a second row of electrical contacts of the component connector from the first position to the second position, (iv) a fourth force required for the indented portions of the leading edge to deform a second portion of the second row of electrical contacts of the component connector from the first position to the second position, and (v) a fifth force to overcome frictional force.

At operation 304, The connection between interchangeable hardware component and component connector may be checked (e.g., to ascertain whether desired electric contacts have been achieved). The connection may be checked by powering on the data processing system and the data processing system doing a power on self-test (POST). If the data processing system is able to power on and take inventory of the interchangeable hardware component, then the connection may be labeled as a good connection. If the data processing system is not able to power on and/or take inventory of the interchangeable hardware component, then the connection may be labeled as a bad connection. The interchangeable hardware component may need to be reinserted and/or replace by another interchangeable hardware component to address the bad connection.

The method may end following operation 304.

By providing methods, devices, and systems, as discussed above, an improved data processing system may be provided that be less likely to damage hardware components of the data processing system and improve the likelihood of the components forming operable connections to one another.

Figure 4:
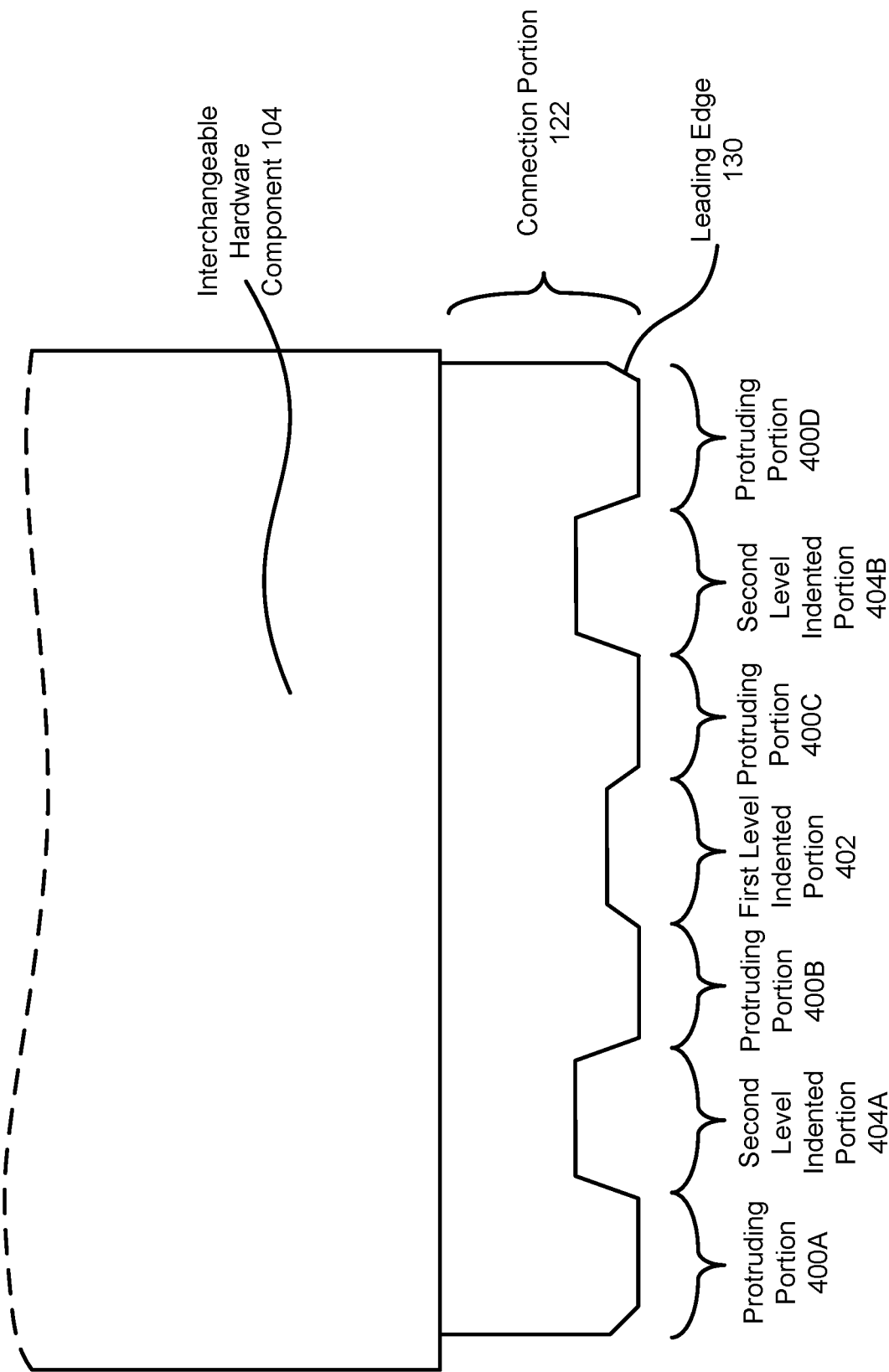
FIG. 4 shows a diagram illustrating an interchangeable hardware component having a multilevel leading edge in accordance with an embodiment.

While described above with respect to indented portions and protruding portions, leading edges of interchangeable hardware components may have more complicated contours. Turning to FIG. 4, a diagram of interchangeable hardware component 104 in accordance with an embodiment is shown.

As seen in FIG. 4, leading edge 130 may include protruding portions (e.g., 400A-400D), and multiple types of indented portions (e.g., 404A, 402, 404B). Different types of the indented portions may have different levels of indention. For example, first level indented portion 402 may be less indented than second level indented portions 404A, 404B.

Thus, an interchangeable hardware component in accordance with embodiments disclosed herein may include leading edges 130 having any number of indented and protruding portions of any number of levels of indentation and/or protrusion. By utilizing multiple levels of indention or protrusion, the peak force for insertion of interchangeable hardware component 104 may be further reduced and/or managed.

For example, an interchangeable hardware component having a flat edge may require a peak force of between 60 and 70 Newton. In contrast, an interchangeable hardware component a staggered edge may reduce this peak force to between 50 and 55 Newton for insertion.

To further clarify embodiments disclosed herein, diagrams illustrating an example process of inserting an interchangeable hardware component having a staggered edge in accordance with an embodiment is shown in FIGS. 5A-5E.

Figure 5A:
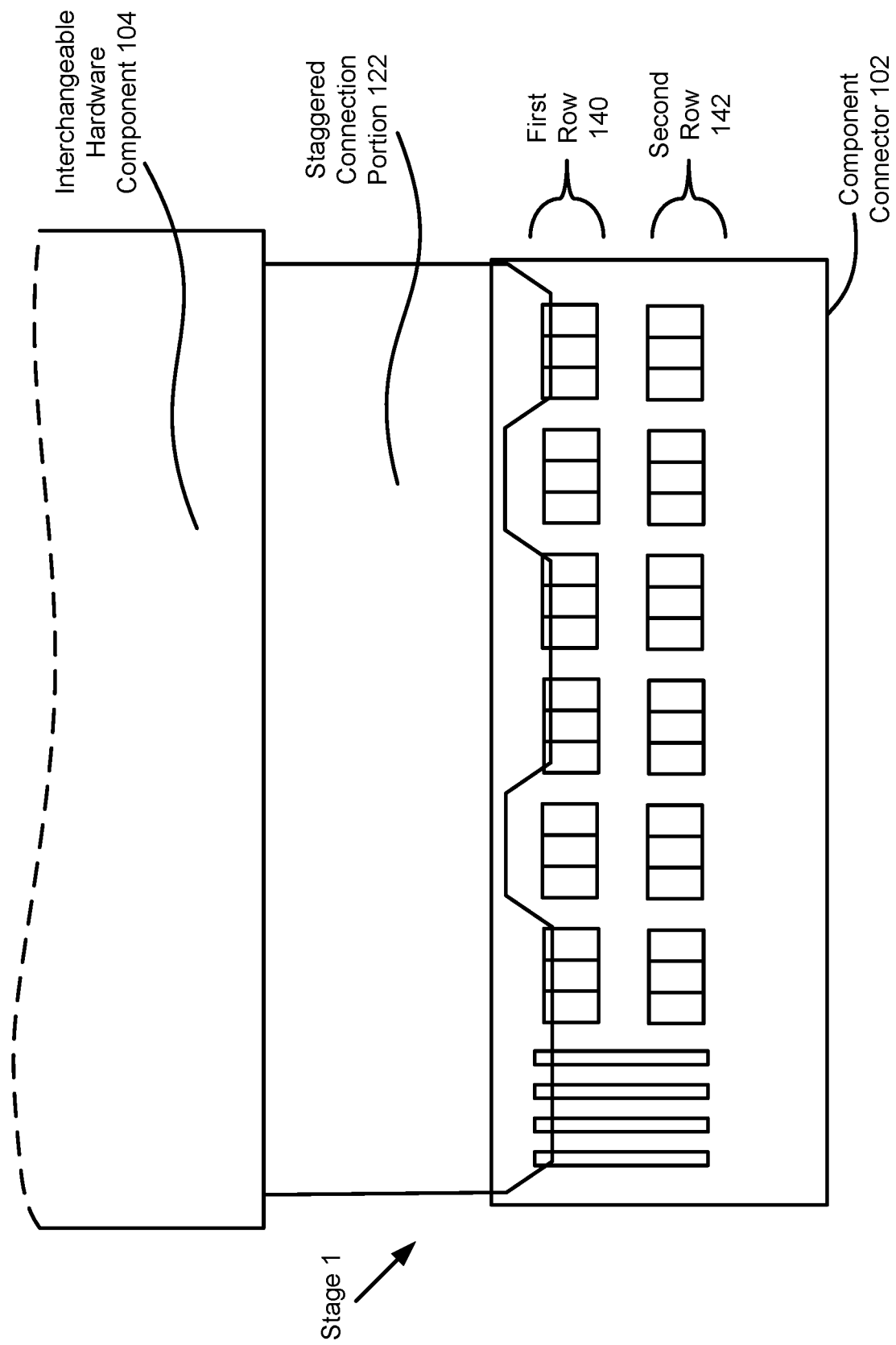
FIGS. 5A-5E show diagrams illustrating a system over time in accordance with an embodiment.

Turning to FIG. 5A, when interchangeable hardware component 104 is initial inserted into component connector 102, the protruding portions of the leading edge may make contact with first row 144, and a first level of force may be applied to deform the deformable features so that insertion may be continued.

Figure 5B:
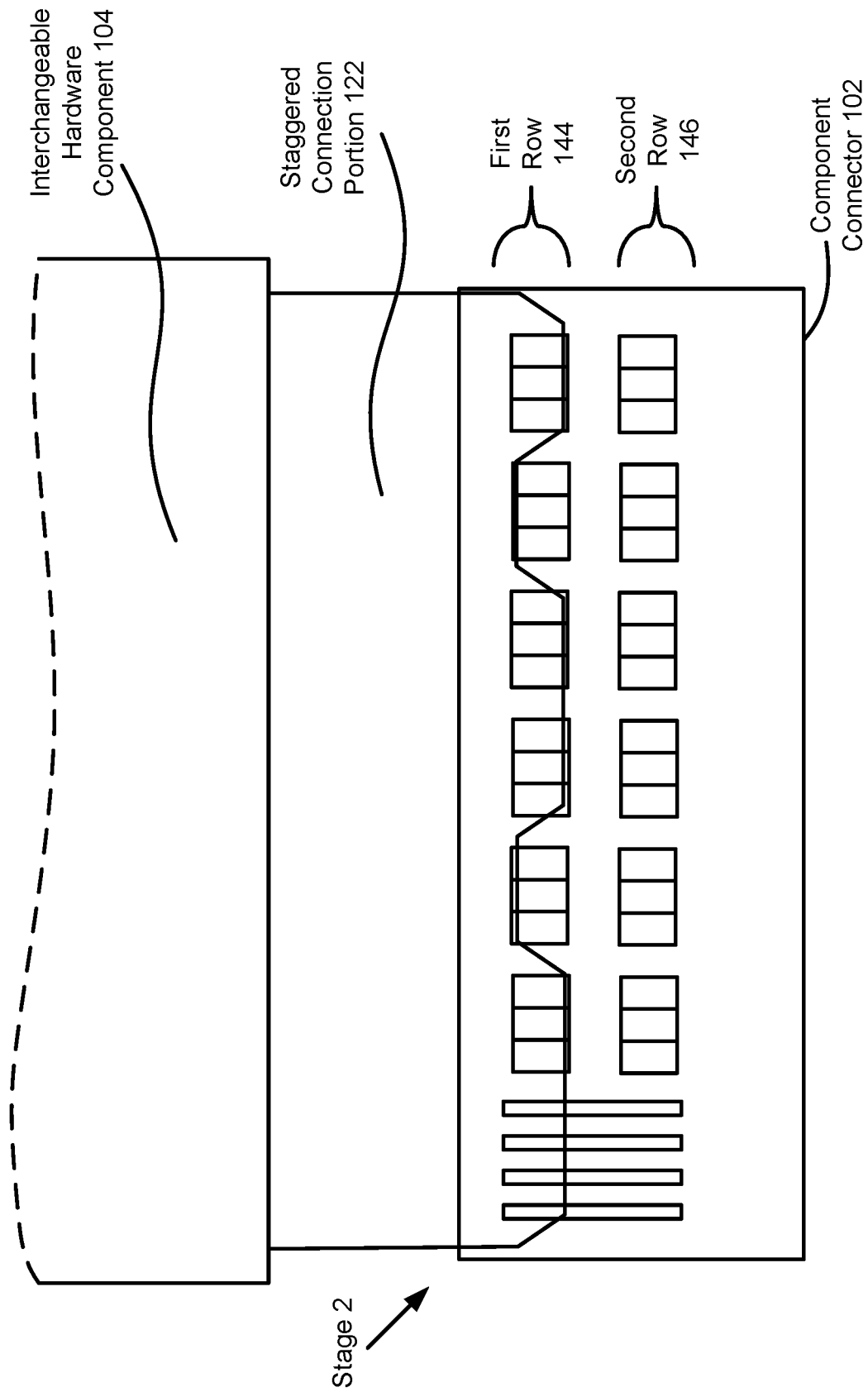

Turning to FIG. 5B, the indented portions of the leading edge may then make contact with first row 144, and a second level of force may be applied to deform the deformable features so that insertion may be continued. The second level of force may be greater than the first level of force, in this example, due to the force required to overcome friction as well as deform the corresponding portion of first row 144.

Figure 5C:
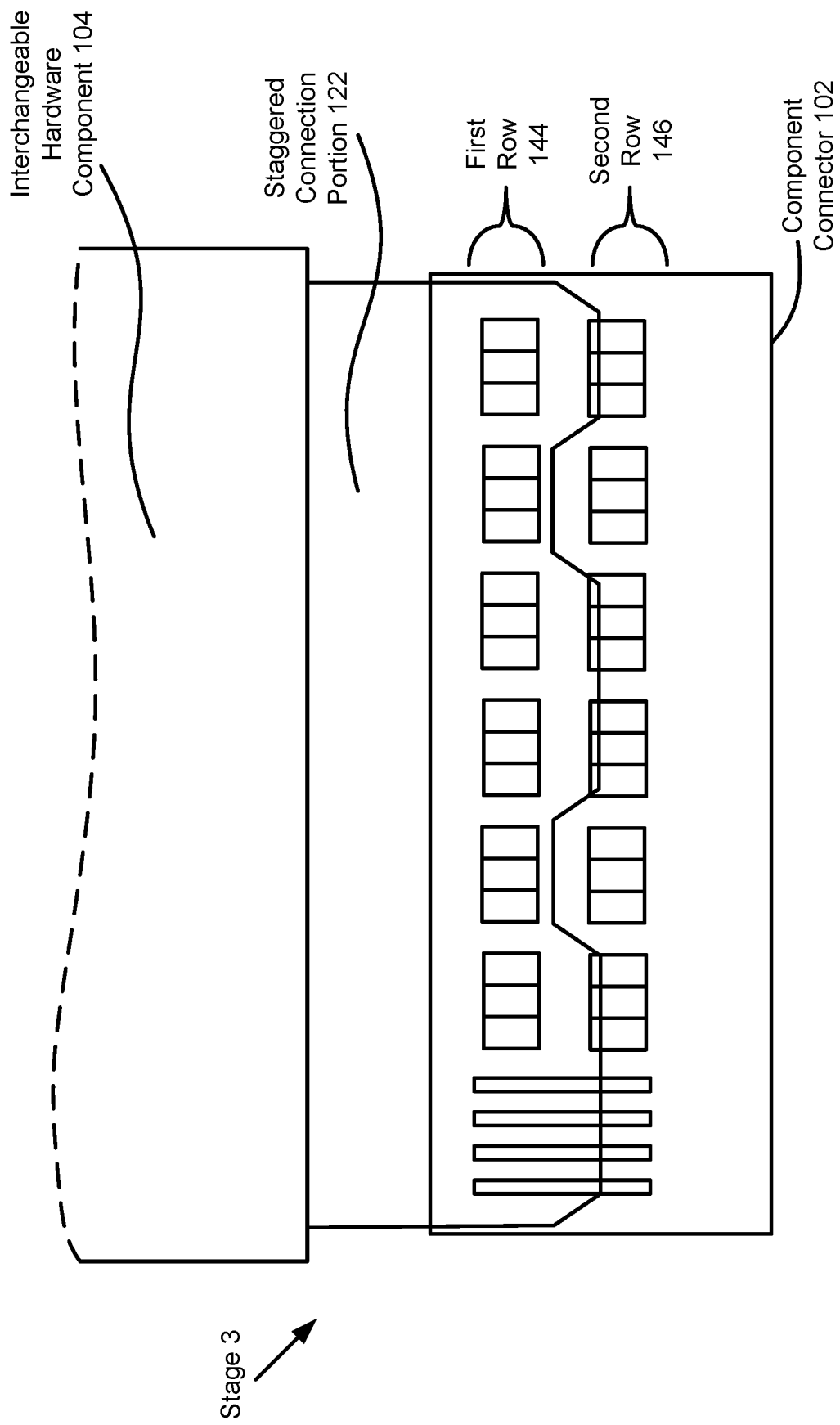

Turning to FIG. 5C, the protruding portion of the leading edge may make contact with second row 146, and a third level of force may be applied to deform the deformable features so that the insertion may continue. The third level of force may be greater than the first level and second level of force, in this example, due to the force required to overcome friction as well as deform the corresponding portion of second row 146.

Figure 5D:
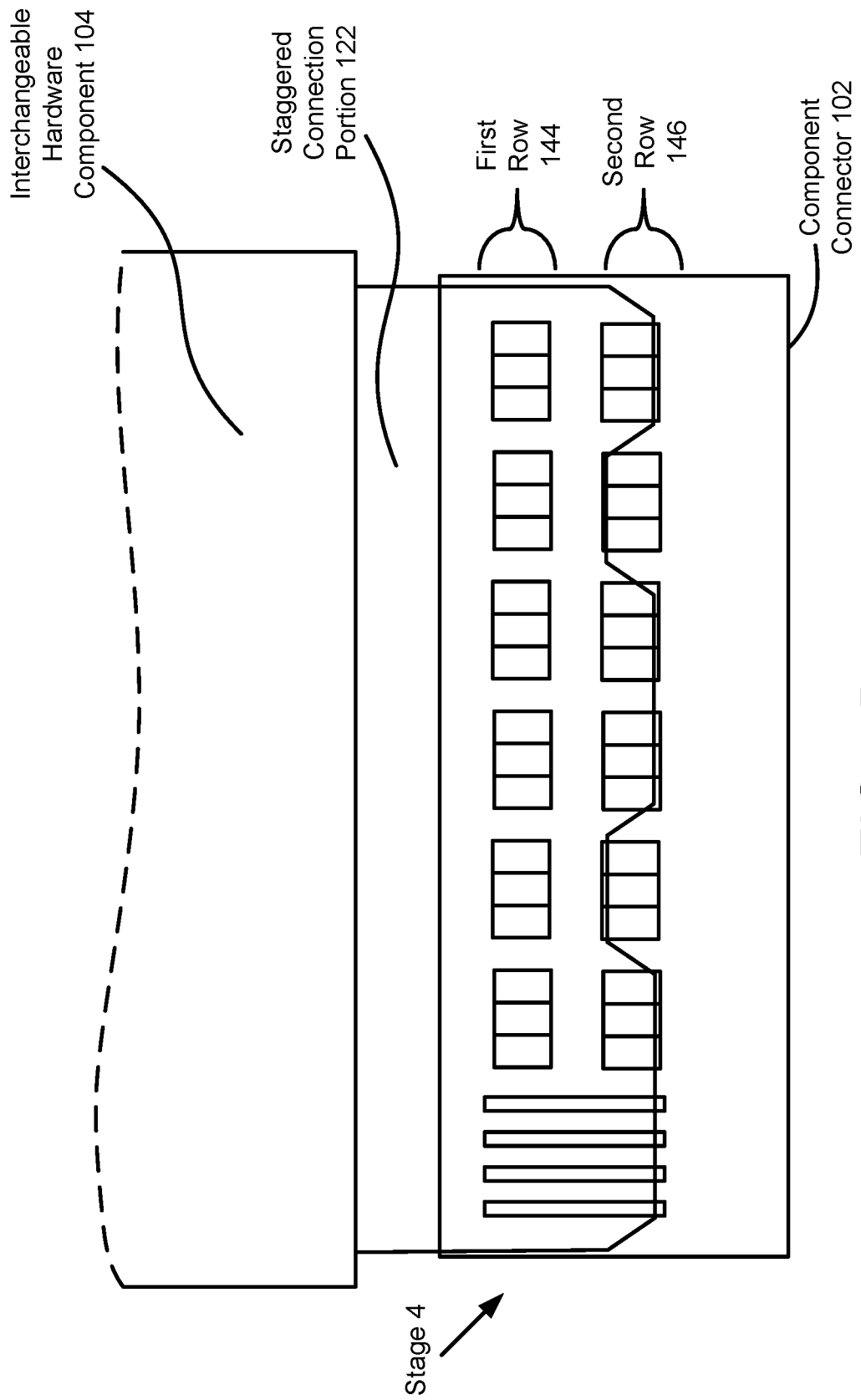

Turning to FIG. 5D, the indented portion of the leading edge may make contact with second row 146, and a fourth level of force may be applied to deform the deformable features so that the insertion may continue. The fourth level of force may be similar to the third level of force.

Figure 5E:
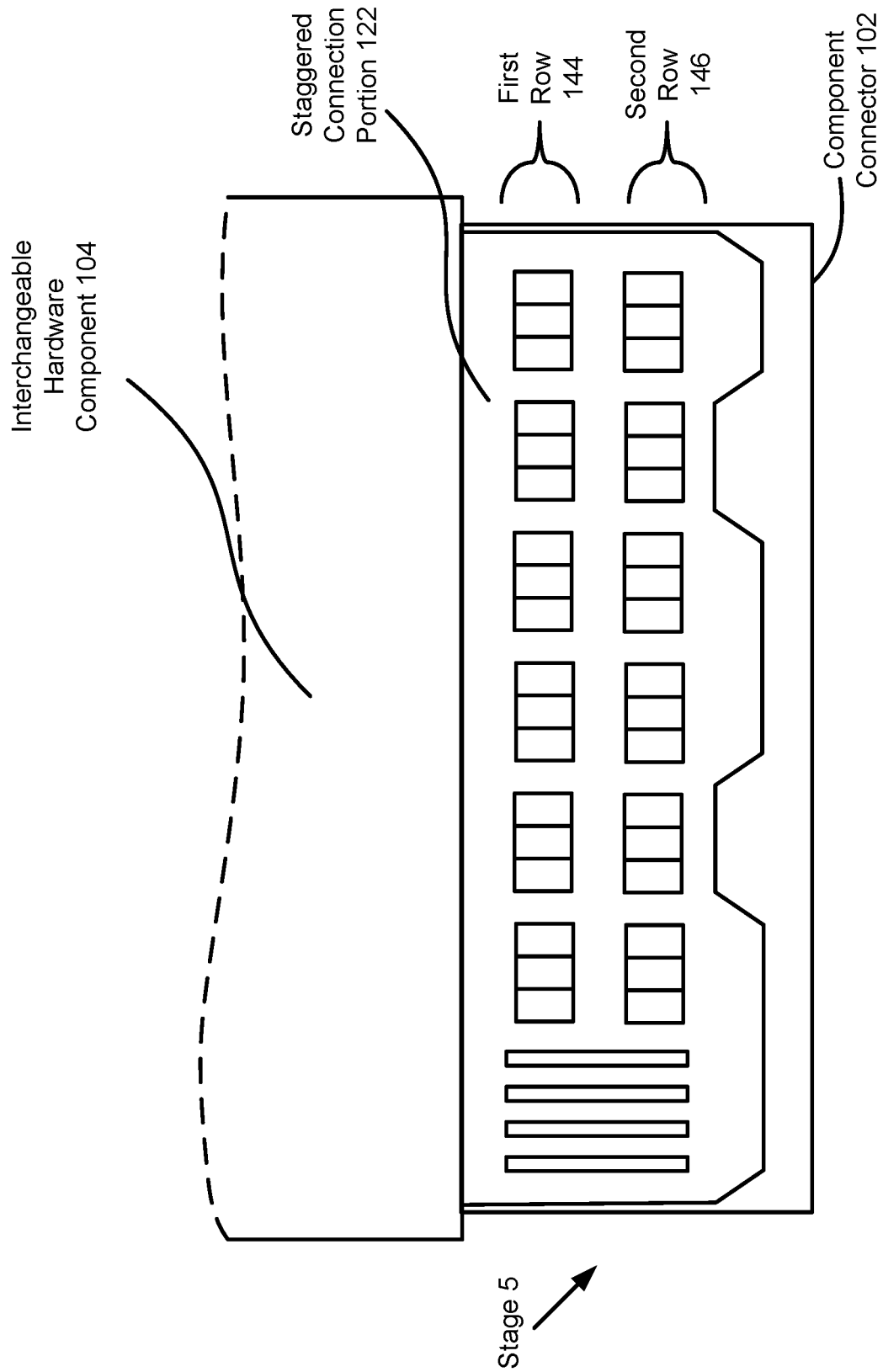

Turning to FIG. 5E, a fifth level of force may be applied to finish insertion of interchangeable hardware component 104. The fifth level of force may be less than the third and fourth levels of force because only friction may resist the continued insertion after the fourth level of force is applied.

Through this process of insertion via application of force, the likelihood of successfully completing insertions may be improved through reduced levels of force required to continue the insertion when compared to the levels of force required to insert interchangeable hardware components having flat leading edges.

Figure 6:
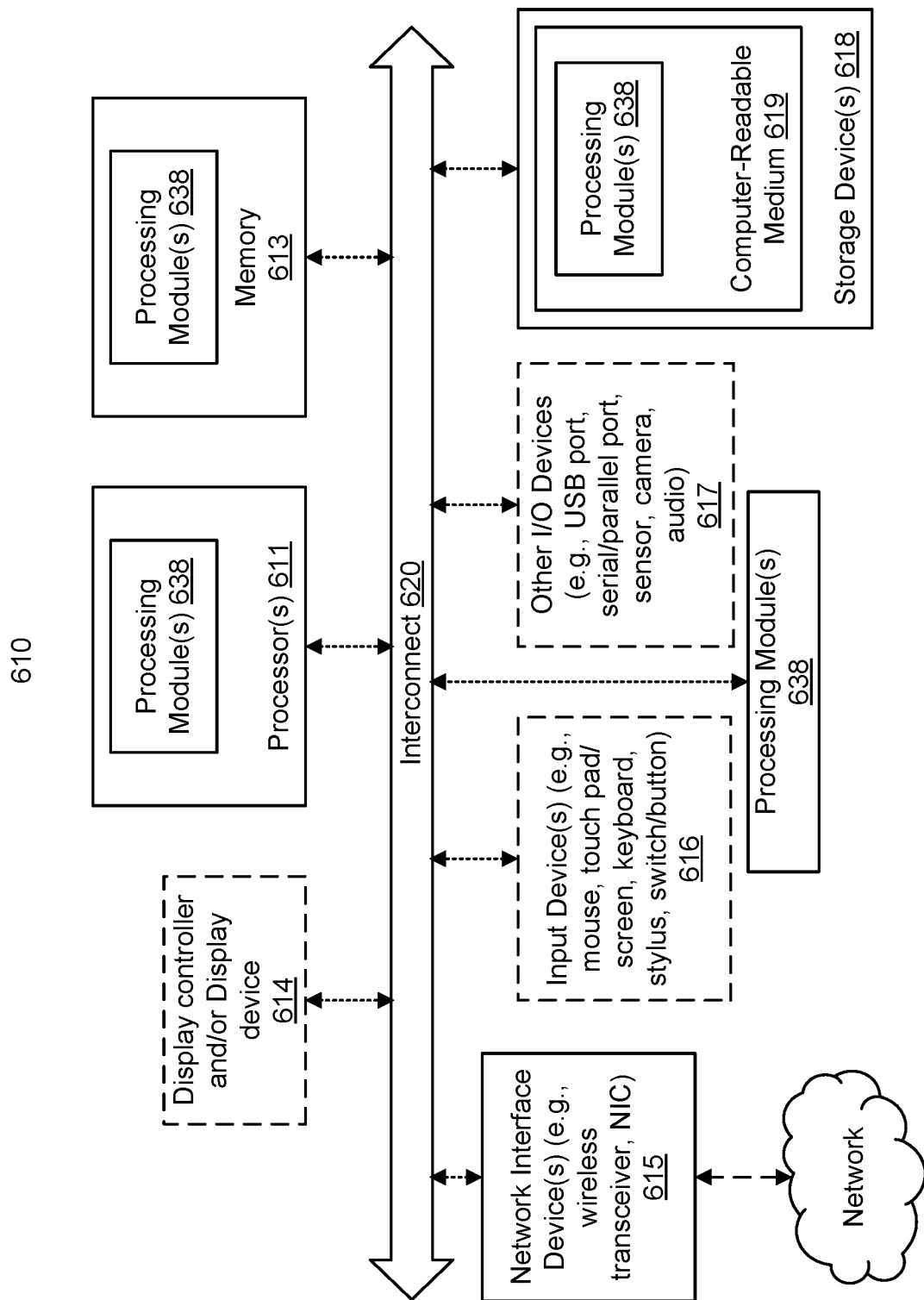
FIG. 6 shows a block diagram illustrating a data processing system in accordance with an embodiment.

Any of the components illustrated in FIGS. 1-5E may be implemented with one or more computing devices. Turning to FIG. 6, a block diagram illustrating an example of a data processing system (e.g., a computing device) in accordance with an embodiment is shown. For example, system 610 may represent any of data processing systems described above performing any of the processes or methods described above. System 610 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 610 is intended to show a high level view of many components of the computer system. However, it is to be understood that additional components may be present in certain implementations and furthermore, different arrangement of the components shown may occur in other implementations. System 610 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 610 includes processor 611, memory 613, and devices 615-617 via a bus or an interconnect 620. Processor 611 may represent a single processor or multiple processors with a single processor core or multiple processor cores included therein. Processor 611 may represent one or more general-purpose processors such as a microprocessor, a central processing unit (CPU), or the like. More particularly, processor 611 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 611 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 611, which may be a low power multi-core processor socket such as an ultra-low voltage processor, may act as a main processing unit and central hub for communication with the various components of the system. Such processor can be implemented as a system on chip (SoC). Processor 611 is configured to execute instructions for performing the operations discussed herein. System 610 may further include a graphics interface that communicates with optional graphics subsystem 614, which may include a display controller, a graphics processor, and/or a display device.

Processor 611 may communicate with memory 613, which in one embodiment can be implemented via multiple memory devices to provide for a given amount of system memory. Memory 613 may include one or more volatile storage (or memory) devices such as random access memory (RAM), dynamic RAM (DRAM), synchronous DRAM (SDRAM), static RAM (SRAM), or other types of storage devices. Memory 613 may store information including sequences of instructions that are executed by processor 611, or any other device. For example, executable code and/or data of a variety of operating systems, device drivers, firmware (e.g., input output basic system or BIOS), and/or applications can be loaded in memory 613 and executed by processor 611. An operating system can be any kind of operating systems, such as, for example, Windows® operating system from Microsoft®, Mac OS®/iOS® from Apple, Android™ from Google®, Linux®, Unix®, or other real-time or embedded operating systems such as VxWorks.

System 610 may further include IO devices such as devices (e.g., 615, 616, 617, 618) including network interface device(s) 615, optional input device(s) 616, and other optional IO device(s) 617. Network interface device(s) 615 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 616 may include a mouse, a touch pad, a touch sensitive screen (which may be integrated with a display device of optional graphics subsystem 614), a pointer device such as a stylus, and/or a keyboard (e.g., physical keyboard or a virtual keyboard displayed as part of a touch sensitive screen). For example, input device(s) 616 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity data collector arrays or other elements for determining one or more points of contact with the touch screen.

IO devices 617 may include an audio device. An audio device may include a speaker and/or a microphone to facilitate voice-enabled functions, such as voice recognition, voice replication, digital recording, and/or telephony functions. Other IO devices 617 may further include universal serial bus (USB) port(s), parallel port(s), serial port(s), a printer, a network interface, a bus bridge (e.g., a PCI-PCI bridge), data collector(s) (e.g., a motion data collector such as an accelerometer, gyroscope, a magnetometer, a light data collector, compass, a proximity data collector, etc.), or a combination thereof. IO device(s) 617 may further include an imaging processing subsystem (e.g., a camera), which may include an optical data collector, such as a charged coupled device (CCD) or a complementary metal-oxide semiconductor (CMOS) optical data collector, utilized to facilitate camera functions, such as recording photographs and video clips. Certain data collectors may be coupled to interconnect 620 via a data collector hub (not shown), while other devices such as a keyboard or thermal data collector may be controlled by an embedded controller (not shown), dependent upon the specific configuration or design of system 610.

To provide for persistent storage of information such as data, applications, one or more operating systems and so forth, a mass storage (not shown) may also couple to processor 611. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 611, e.g., via a serial peripheral interface (SPI). This flash device may provide for non-volatile storage of system software, including a basic input/output software (BIOS) as well as other firmware of the system.

Storage device 618 may include computer-readable storage medium 619 (also known as a machine-readable storage medium or a computer-readable medium) on which is stored one or more sets of instructions or software (e.g., processing module, unit, and/or processing module/unit/logic 638) embodying any one or more of the methodologies or functions described herein. Processing module/unit/logic 638 may represent any of the components described above. Processing module/unit/logic 638 may also reside, completely or at least partially, within memory 613 and/or within processor 611 during execution thereof by system 610, memory 613 and processor 611 also constituting machine-accessible storage media. Processing module/unit/logic 638 may further be transmitted or received over a network via network interface device(s) 615.

Computer-readable storage medium 619 may also be used to store some software functionalities described above persistently. While computer-readable storage medium 619 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 638, components and other features described herein can be implemented as discrete hardware components or integrated in the functionality of hardware components such as ASICS, FPGAs, DSPs or similar devices. In addition, processing module/unit/logic 638 can be implemented as firmware or functional circuitry within hardware devices. Further, processing module/unit/logic 638 can be implemented in any combination hardware devices and software components.

Note that while system 610 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A data processing system for providing computer-implemented services using interchangeable hardware components, comprising:
   a processor;
   a component connector electrically connected to the processor and adapted to receive at least one of the interchangeable hardware components;
   the one interchangeable hardware component comprising:
      a discrete hardware component for providing the computer-implemented services in cooperation with the processor;
      a connection portion comprising:
         electrical contacts adapted to form electrical connections with the component connector to facilitate communication between the discrete hardware component and the processor;
         a leading edge adapted to be inserted into the component connector and deform electrical contacts of the component connector that are complementary to the electrical contacts of the connection portion to establish a communication path for the communication between the discrete hardware component and the processor, the leading edge comprising:
            a protruding portion, and
            an indented portion adapted to make physical contact with the electrical contacts of the components connector after the protruding portion makes physical contact with the electrical contacts during an insertion of the leading edge into the component connector.

2. The data processing system of claim 1, wherein the communication path is operable while the electrical contacts of the connection portion are in physical contact with the electrical contacts of the component connector.

3. The data processing system of claim 1, wherein the protruding portion has a protrusion depth of an amount based on a degree of insertion of the protruding portion into the component connector required to deform a portion of the electrical contacts of the component connector from a first position to a second position prior to the indented portion making physical contact with any of the electrical contacts of the component connector.

4. The data processing system of claim 3, wherein the first position is an at rest position where no forces are applied by the connection portion to the electrical contacts of the component connector.

5. The data processing system of claim 4, wherein the second position is a deformed position where the forces are applied by the connection portion to the electrical contacts of the component connector.

6. The data processing system of claim 1, wherein the leading edge further comprises:
   a second protruding portion.

7. The data processing system of claim 6, wherein the indented portion is positioned between the protruding portion and the second protruding portion.

8. The data processing system of claim 6, wherein the leading edge further comprises:
   a plurality of protruding portions comprising the protruding portion and the second protruding portion; and
   a plurality of indented portions comprising the indented portion.

9. The data processing system of claim 8, wherein the plurality of protruding portions and the plurality of indented portions are positioned in an alternating pattern.

10. The data processing system of claim 9, wherein each of the plurality of protruding portions is substantially similar to other protruding portions of the plurality of the protruding portions.

11. The data processing system of claim 1, wherein the leading edge further comprises:
    a second indented portion, the indented portion and the second indented portion having different levels of indentations such that the protruding portions, the indented portion and the second indented portions make initial physical contact with the electrical contacts of the component connector at different times during insertion of the leading edge into the component connector.

12. The data processing system of claim 1, wherein the protruding portion has a width corresponding to a subset of the electrical contacts of the components connector, the subset of the electrical contacts being mechanically linked to each other for deformation and mechanically delinked from other subsets of the electrical contacts for deformation.

13. An interchangeable hardware component comprising:
    a discrete hardware component for providing computer-implemented services in cooperation with a processor of a host data processing system;
    a connection portion comprising:
       electrical contacts adapted to form electrical connections with a component connector of the host data processing system to facilitate communication between the discrete hardware component and the processor;
       a leading edge adapted to be inserted into the component connector and deform electrical contacts of the component connector that are complementary to the electrical contacts of the connection portion to establish a communication path for the communication between the discrete hardware component and the processor, the leading edge comprising:
          a protruding portion, and
          an indented portion adapted to make physical contact with the electrical contacts of the components connector after the protruding portion makes physical contact with the electrical contacts during an insertion of the leading edge into the component connector.

14. The interchangeable hardware component of claim 13, wherein the communication path is operable while the electrical contacts of the connection portion are in physical contact with the electrical contacts of the component connector.

15. The interchangeable hardware component of claim 13, wherein the protruding portion has a protrusion depth of an amount based on a degree of insertion of the protruding portion into the component connector required to deform a portion of the electrical contacts of the component connector from a first position to a second position prior to the indented portion making physical contact with any of the electrical contacts of the component connector.

16. The interchangeable hardware component of claim 15, wherein the first position is an at rest position where no forces are applied by the connection portion to the electrical contacts of the component connector.

17. The interchangeable hardware component of claim 16, wherein the second position is a deformed position where the forces are applied by the connection portion to the electrical contacts of the component connector.

18. The interchangeable hardware component of claim 13, wherein the leading edge further comprises:
   a second protruding portion.

19. The interchangeable hardware component of claim 18, wherein the indented portion is positioned between the protruding portion and the second protruding portion.

20. The interchangeable hardware component of claim 19, wherein the leading edge further comprises:
   a plurality of protruding portions comprising the protruding portion and the second protruding portion; and
   a plurality of indented portions comprising the indented portion.

\* \* \* \* \*